(12) United States Patent
Usami et al.

(10) Patent No.: US 7,488,995 B2
(45) Date of Patent: Feb. 10, 2009

(54) SEMICONDUCTOR INTEGRATED CIRCUIT DEVICE AND I/O CELL FOR THE SAME

(75) Inventors: Shiro Usami, Kyoto (JP); Daisuke Matsuoka, Osaka (JP)

(73) Assignee: Panasonic Corporation, Osaka (JP)

( * ) Notice: Subject to any disclaimer, the term of this patent is extended or adjusted under 35 U.S.C. 154(b) by 530 days.

(21) Appl. No.: 11/371,284

(22) Filed: Mar. 9, 2006

(65) Prior Publication Data

US 2006/0236175 A1 Oct. 19, 2006

(30) Foreign Application Priority Data

Apr. 5, 2005 (JP) ............................. 2005-109106

(51) Int. Cl.
*H01L 27/00* (2006.01)
*H01L 27/04* (2006.01)

(52) U.S. Cl. ...................................... 257/203; 327/565
(58) Field of Classification Search ................. 257/203; 327/565
See application file for complete search history.

(56) References Cited

U.S. PATENT DOCUMENTS

| | | | | |
|---|---|---|---|---|
| 4,945,395 A | * | 7/1990 | Suehiro | 257/203 |
| 5,134,314 A | * | 7/1992 | Wehrmacher | 326/9 |
| 6,677,780 B2 | * | 1/2004 | Tanaka et al. | 326/62 |
| 6,721,933 B2 | * | 4/2004 | Iwasa | 716/10 |
| 7,165,232 B2 | * | 1/2007 | Chen et al. | 716/8 |
| 2002/0056857 A1 | * | 5/2002 | Iwasa | 257/203 |
| 2005/0127405 A1 | * | 6/2005 | Chen et al. | 257/203 |
| 2006/0236175 A1 | * | 10/2006 | Usami et al. | 714/724 |

FOREIGN PATENT DOCUMENTS

JP 04-051714 2/1992

* cited by examiner

*Primary Examiner*—Evan Pert
(74) *Attorney, Agent, or Firm*—McDermott Will & Emery LLP

(57) ABSTRACT

In a semiconductor integrated circuit device in which a plurality of I/O cells having level shift circuits are placed in an I/O region, two input/output cells respectively have four level shift circuits 11, 12a to 12c. A power supply cell, originally including only wiring for supply of a power supply voltage or a ground voltage, is additionally provided with three level shift circuits, which should originally be placed in the two input/output cells. The level shift circuits in the power supply cell are circuits asked for no high-speed operation and shared by the two input/output cells. This reduces the size of the two input/output cells and reduces the pitch of the I/O cells, permitting a larger number of required pins in a smaller area.

23 Claims, 15 Drawing Sheets

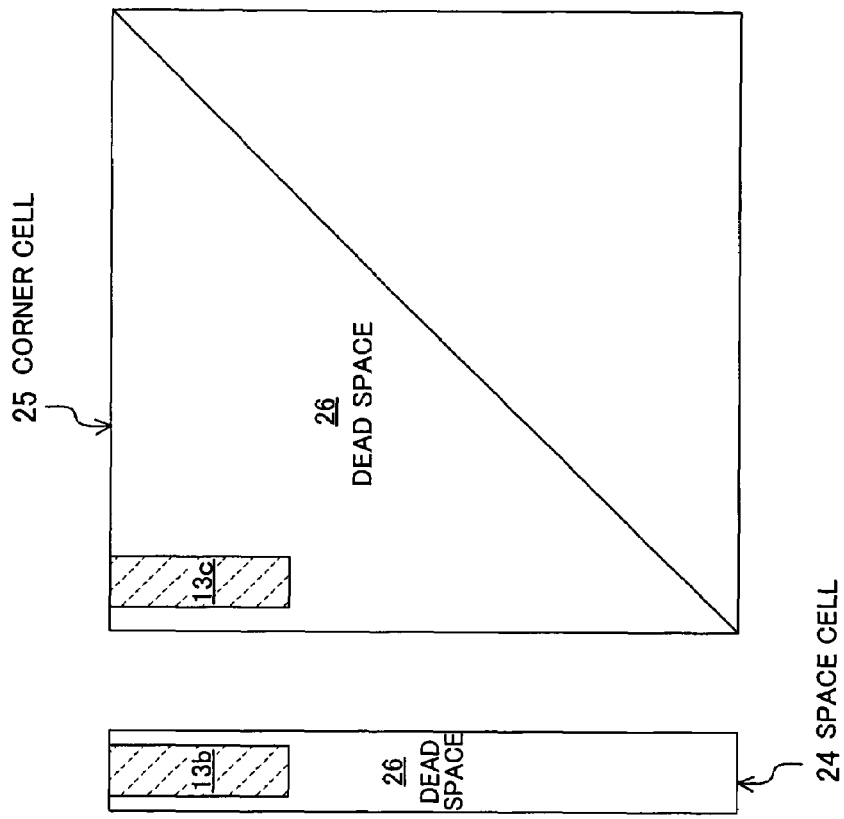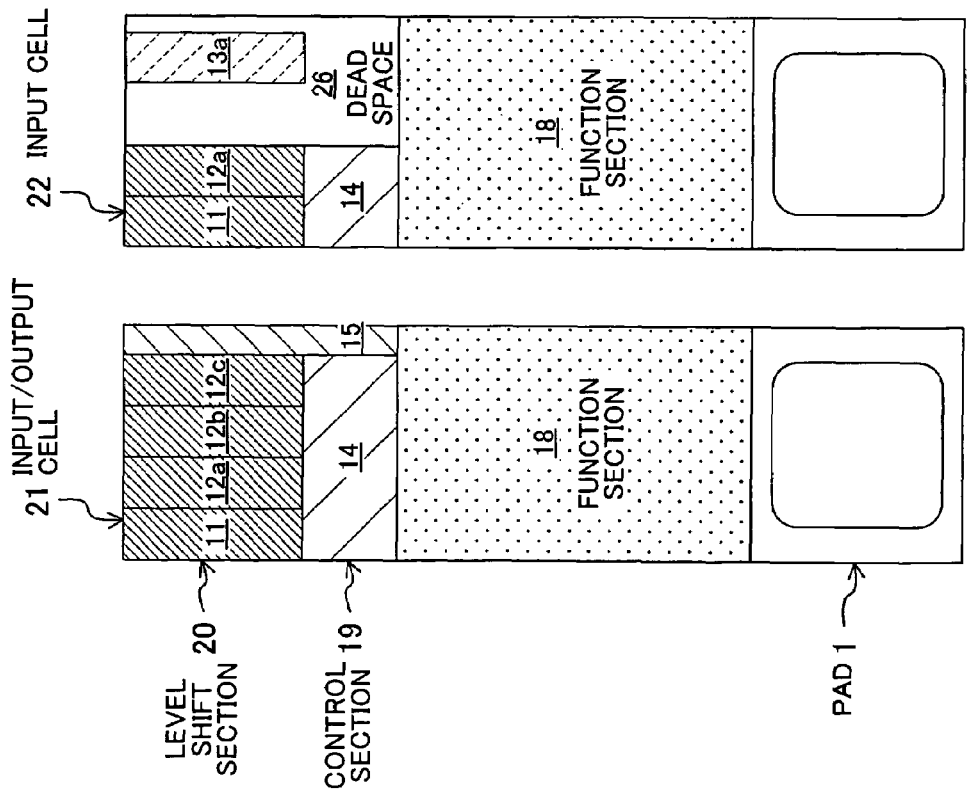

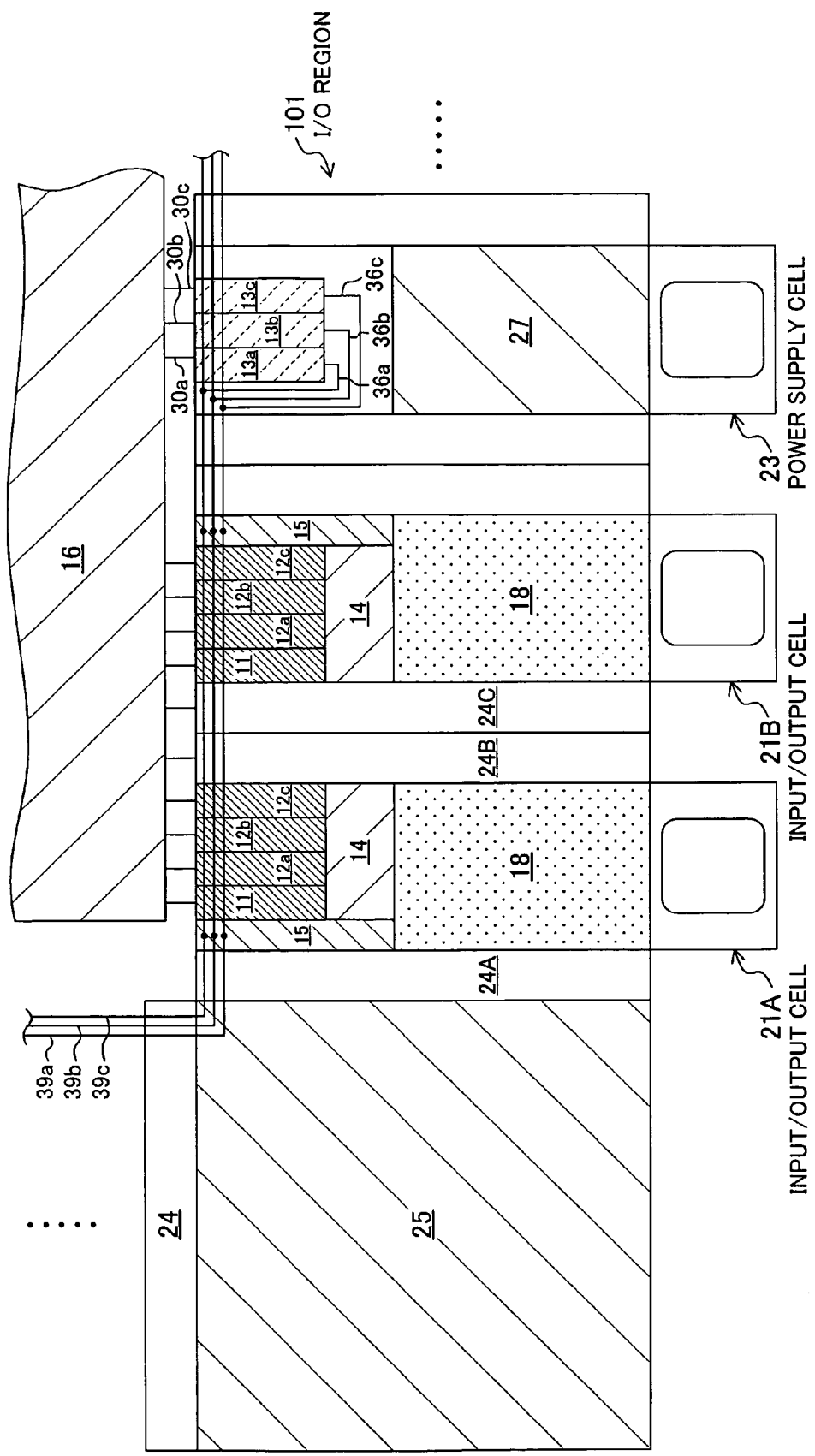

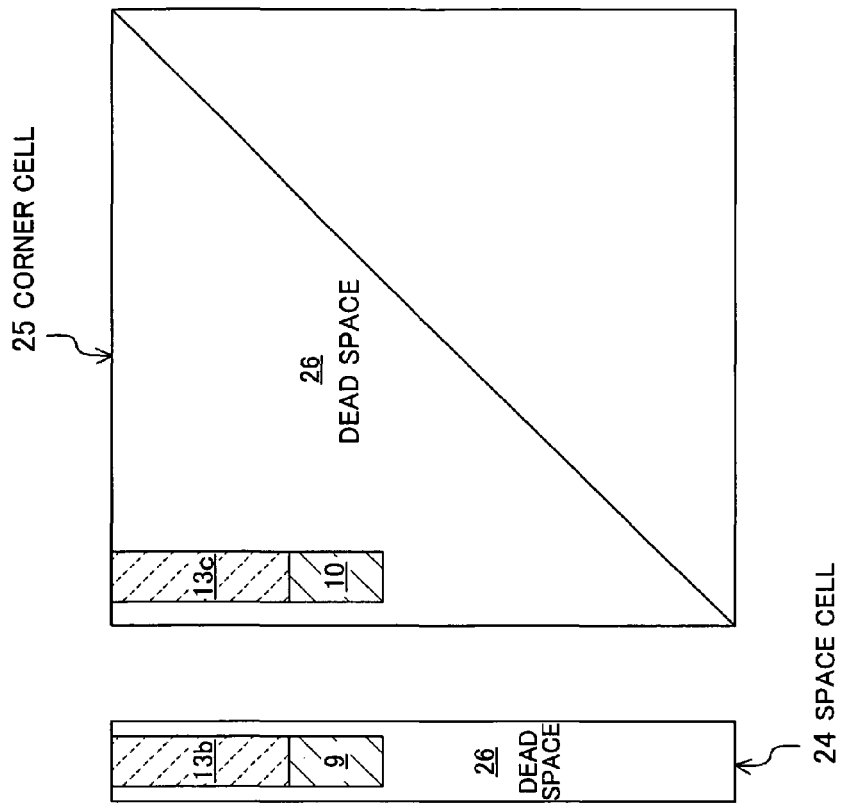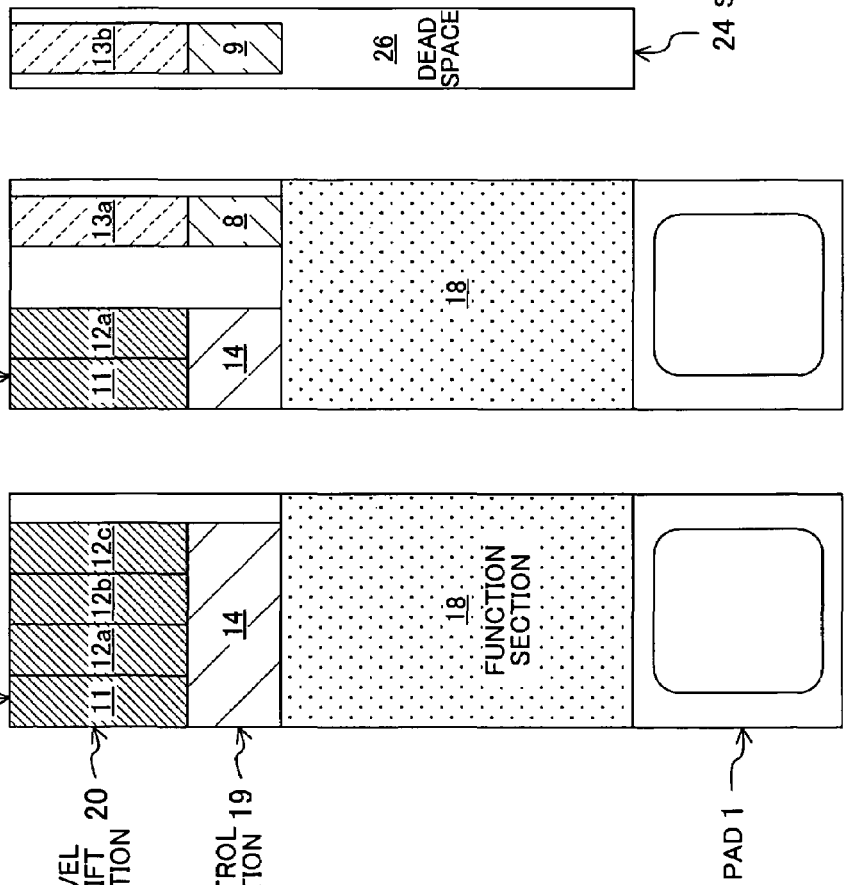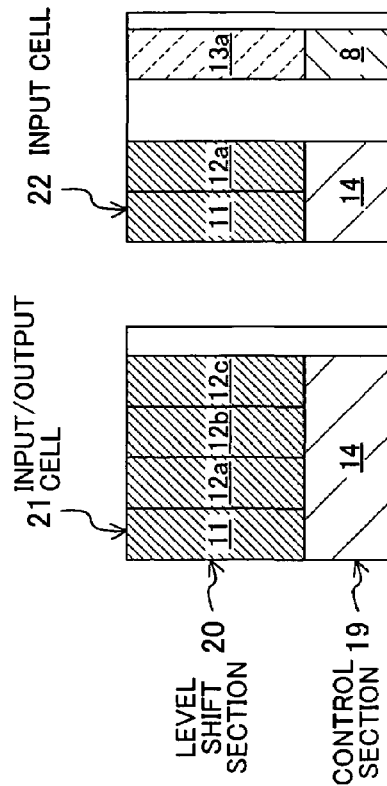

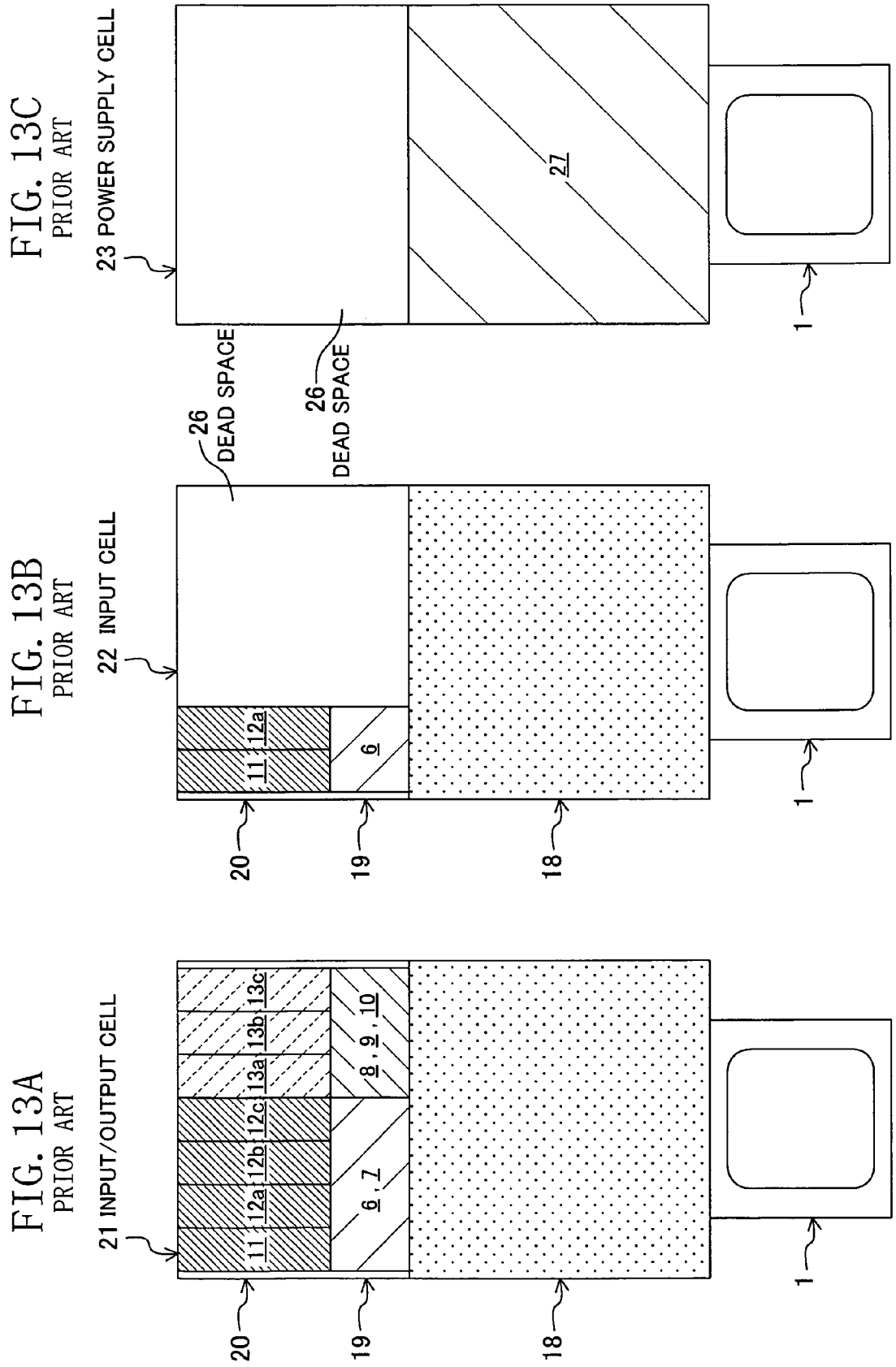

FIG. 14A
PRIOR ART
FIG. 14B
PRIOR ART
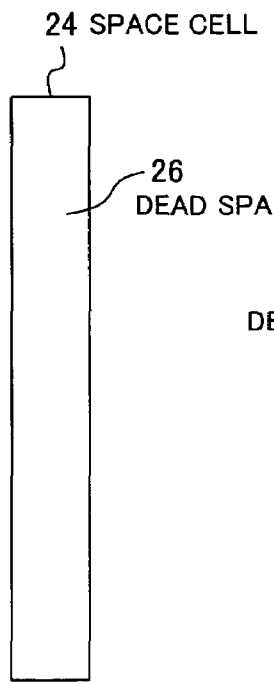
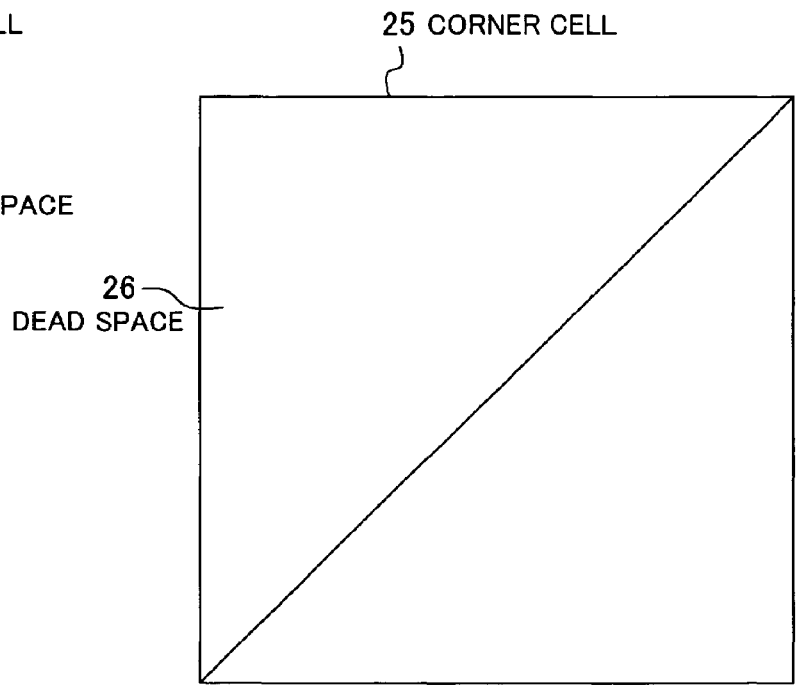

SEMICONDUCTOR INTEGRATED CIRCUIT DEVICE AND I/O CELL FOR THE SAME

CROSS-REFERENCE TO RELATED APPLICATIONS

This application claims priority under 35 U.S.C. §119(a) on Patent Application No. 2005-109106 filed in Japan on Apr. 5, 2005, the entire contents of which are hereby incorporated by reference.

BACKGROUND OF THE INVENTION

The present invention relates to a semiconductor integrated circuit device provided with level shift circuits for shifting the potential level of a signal input or output into/from an internal logic circuit from/to the outside.

With the recent process scaling-down achievement, the power supply voltage for internal circuits of a semiconductor integrated circuit tends to be increasingly lowered. In systems such as electronic equipment, however, some semiconductor elements used in the systems still adopt the conventional power supply voltage. Therefore, in such a system, on the occasion of conducting transmission/reception of a signal between such a semiconductor element and a semiconductor integrated circuit, a level shift circuit for shifting the voltage level of the signal is generally provided inside the semiconductor integrated circuit, to thereby secure interface between the semiconductor element and the semiconductor integrated circuit different in power supply voltage.

Also, recently, a power supply voltage optimum for each circuit block is supplied individually inside a semiconductor integrated circuit to attain power reduction. In this case, also, a level shift circuit is used for securing interface between circuit blocks different in power supply voltage.

Under the circumstances described above, in a semiconductor integrated circuit provided with level shift circuits, the level shift circuits are placed inside I/O cells as the interface section located around the periphery of an internal logic circuit, to perform a voltage level shift between the internal voltage of the semiconductor chip and the external voltage, as described in Japanese Patent Gazette No. 3233627, for example.

FIG. 1 shows a schematic layout of such a semiconductor integrated circuit (semiconductor chip). Referring to FIG. 1, the reference numeral 100 denotes a semiconductor substrate, 102 an internal logic circuit region, and 101 an I/O region located around the periphery of the internal logic circuit region 102. In the I/O region 101, a plurality of I/O cells (in the illustrated example, only three I/O cells 21, 22 and 23 are shown) are placed in line. Corner cells 103 are placed in the corners of the semiconductor substrate 100.

FIG. 2 shows an exemplified internal configuration of one of the I/O cells (I/O cell 21, for example). The illustrated I/O cell 21, which is for input/output of a signal (input/output cell 21), is largely divided into four sections: a pad 1 for external connection, a function section 18, a control section 19 and a level shift section 20. The function section 18 includes an input circuit 2, an output circuit 3, a pull-up/pull-down circuit 4 and an ESD protection circuit 5. The input circuit 2 has an input function of inputting a signal sent from outside the semiconductor chip into the internal logic circuit 16 in the semiconductor chip. The output circuit 3 has an output function of outputting a signal from the internal logic circuit 16 to outside the semiconductor chip. The pull-up/pull-down circuit 4 has a pull-up/pull-down function for fixing the pad 1 at "H" or "L" level when the input/output cell 21 is in neither the signal input state nor the signal output state. The ESD protection circuit 5 has a function of protecting circuits in the semiconductor chip from electrostatic discharge (ESD).

The control section 19 includes: an input control circuit 6 and an output control circuit 7 for controlling the input circuit 2 and the output circuit 3, respectively, as well as making sure that the signal input function and the signal output function never occur simultaneously; an output current switch control circuit 8 for switching the output current capability of the output circuit 3 among a plurality of stages; a pull-up/pull-down ON/OFF control circuit 9 for controlling operation/non-operation of the pull-up/pull-down circuit 4; and a pull-up/pull-down switch control circuit 10 for controlling which function of the pull-up/pull-down circuit 4, the pull-up function or the pull-down function, is to be used. The control circuits 6 to 10 of the function section 19 are respectively constructed of transistors operating with an external voltage.

The level shift section 20 includes a level shift circuit 11 for the input circuit 2 and six level shift circuits 12a to 12c and 13a to 13c for the control circuits 6 to 10 of the control section 19. When the internal logic circuit 16 is a circuit operating with low-voltage power supply, each of these level shift circuits will be a level shift-up circuit if configured to receive a signal from the internal logic circuit 16 or a level shift-down circuit if configured to output a signal to the internal logic circuit 16.

In the conventional semiconductor integrated circuit described above, a total of seven level shift circuits are necessary for the I/O cell 21 having the input/output function (input/output cell 21) shown in FIG. 2, for example, and this increases the size of the I/O cell. With the recent implementation of system LSI, the necessary number of pins for a semiconductor chip increases. Under this circumstance, with the increase in the size of one I/O cell, the I/O region including I/O cells of the number equal to the necessary number of pins will also become large. As a result, the size of the semiconductor chip will be determined with the size of the I/O region, and this will cause disadvantages such as having wasteful space unused for placement of circuits in the internal logic circuit placement region.

As a solution for the above, it may be suggested that a plurality of level shift circuits may be placed in the logic circuit placement region inside the semiconductor chip, for example. However, this will also lead to increase in the area of the semiconductor chip, and thus should not be adopted.

SUMMARY OF THE INVENTION

To overcome the above problem, the inventors of the present invention conducted examinations on whether there is any room for improvement in the circuit configuration and layout of I/O cells.

As a result of the examinations, various types of I/O cells were found available and from the difference among the types, the following were found. FIGS. 13A to 13C, 14A and 14B show configurations of various types of I/O cells. FIG. 13A shows a layout of the input/output cell 21 shown in FIG. 2, in which the function section 18 is placed in a portion above the pad 1 as is viewed from FIG. 13A (portion closer to the inner part of the semiconductor chip with respect to the pad 1), the control section 19 is placed in a portion above the function section 18, and the seven level shift circuits 11, 12a to 12c and 13a to 13c are placed in a portion above the control section 19. FIG. 13B shows a layout of an input cell 22, in which only the input circuit 2 constituting the function section 18, the input control circuit 6 and two level shift circuits 11 and 12a are placed. FIG. 13C shows a layout of a power supply cell 23 for supplying a power supply voltage and a ground voltage, in which the ESD protection circuit 27 is placed in a portion above the pad 1, and above the ESD protection circuit 27, dead space 26 extends in which no semiconductor elements such as transistors are placed but only ring power supply wiring (not shown) is arranged.

FIG. 14A shows a layout of a space cell 24 for filling the space between two I/O cells, in which dead space 26 extends over the entire area. FIG. 14B shows a layout of a corner cell 25 provided for linking a longitudinal part and a lateral part of the ring power supply wiring arranged around the semiconductor chip, in which dead space 26 extends over the entire area. In particular, in an I/O cell large in the number of level shift circuits provided, such as the input/output cell 21, among the above I/O cells, some of the level shift circuits may be placed, not inside the own I/O cell, but in any other location in the I/O region such as in an I/O cell having dead space. By this placement, the size of the I/O cell having the largest area can be reduced, and as a result, the pitch of the plurality of I/O cells can be reduced. In this way, the area of a semiconductor chip having the necessary number of pins can be reduced.

In view of the above, an object of the present invention is providing a semiconductor integrated circuit having level shift circuits placed in I/O cells, in which the pitch of the I/O cells can be reduced to achieve reduction in the area of the semiconductor is chip having the necessary number of pins.

To attain the object described above, the present invention adopts a configuration of placing level shift circuits for a given I/O cell in a location outside the given I/O cell within an I/O region.

When a level shift circuit is placed outside its own I/O cell, however, a long line for linking the level shift circuit to the inside of its own I/O cell will become necessary. This will impair the high-speed capability of the level shift circuit if the level shift circuit is asked for high-speed operation.

In relation to the above, the inventors examined the internal configurations of various types of I/O cells and found the following. In the input/output cell 21 shown in FIG. 2, for example, the level shift circuits 11 and 12a to 12c are asked for high-speed operation because the input circuit 2, the output circuit 3, the input control circuit 6 and the output control circuit 7 must send/receive signals to/from the internal logic circuit 16 at high speed. On the contrary, the output current switch control circuit 8, the pull-up/pull-down ON/OFF control circuit 9 and the pull-up/pull-down switch control circuit 10 do not operate so frequency and, once operating, maintain the operation for a long time (DC-like operation), and thus no high-speed operation is required. Therefore, the level shift circuits 13a to 13c connected to these control circuits 8 to 10 are not asked for high-speed operation, either.

In view of the above, another object of the present invention is providing a semiconductor integrated circuit capable of securing high-speed operation of an inner logic circuit even though level shift circuits are placed outside their own I/O cells. To attain this object, according to the present invention, level shift circuits that are not asked for high-speed operation are selected and placed outside their own I/O cells.

The semiconductor integrated circuit device of the present invention includes: an internal logic circuit; and a plurality of I/O cells placed in an I/O region located around the periphery of the internal logic circuit for securing interface with an external signal, wherein at least one given I/O cell among the plurality of I/O cells has at least one level shift circuit, and the level shift circuit for the given I/O cell is placed in a given location outside the given I/O cell and within the I/O region.

In one embodiment of the invention, the level shift circuit for the given I/O cell, placed in the given location within the I/O region, is connected to the internal logic circuit via a line and also connected to the given I/O cell via another line.

In another embodiment of the invention, the given I/O cell is an input/output cell for inputting/outputting a signal into/from the internal logic circuit from/to outside.

In yet another embodiment of the invention, the given I/O cell is an output cell for outputting a signal from the internal logic circuit to outside.

In yet another embodiment of the invention, the given I/O cell is an input cell for inputting a signal from outside into the internal logic circuit.

In yet another embodiment of the invention, the level shift circuit for the given I/O cell is a level shift-up circuit that is not asked for high-speed operation equivalent to high-speed operation of the internal logic circuit and shifts the level of a signal from the internal logic circuit upwardly to an external signal voltage.

In yet another embodiment of the invention, the I/O cells placed in the I/O region include a power supply cell, and the given location within the I/O region in which the level shift circuit for the given I/O cell is placed is inside the power supply cell.

In yet another embodiment of the invention, the I/O cells placed in the I/O region include a space cell for filling the gap between two given I/O cells, and the given location within the I/O region in which the level shift circuit for the given I/O cell is placed is inside the space cell.

In yet another embodiment of the invention, the I/O cells placed in the I/O region include a corner cell for linking a longitudinal part and a lateral part of the I/O region, and the given location within the I/O region in which the level shift circuit for the given I/O cell is placed is inside the corner cell.

In yet another embodiment of the invention, the I/O cells placed in the I/O region include an input cell for inputting a signal from outside into the internal logic circuit, and the given location within the I/O region in which the level shift circuit for the given I/O cell is placed is inside the input cell.

In yet another embodiment of the invention, the given I/O cell includes a control circuit that is connected to the level shift circuit and is not asked for high-speed operation, and the control circuit is placed in a given location outside the given I/O cell and within the I/O region, together with the level shift circuit.

In yet another embodiment of the invention, the control circuit is an output current switch control circuit for switching the output current capability from the given I/O cell.

In yet another embodiment of the invention, the control circuit is an ON/OFF control circuit for switching whether to use or not a pull-up or pull-down function for fixing the potential at a terminal of the given I/O cell to "H" or "L".

In yet another embodiment of the invention, the control circuit is a pull-up/pull-down switch control circuit for fixing the potential at a terminal of the given I/O cell to "H" or "L".

In yet another embodiment of the invention, the given I/O cell includes a plurality of given I/O cells, the plurality of given I/O cells share the at least one level shift circuit, and the shared level shift circuit is placed in a given location outside the given I/O cells and within the I/O region.

In yet another embodiment of the invention, the level shift circuit placed in a given location within the I/O region is connected to the given I/O cell via a line arranged outside the I/O region.

In yet another embodiment of the invention, the level shift circuit placed in a given location within the I/O region is connected to the given I/O cell via a line arranged to run above the I/O region.

The I/O cell of the present invention is an I/O cell placed in an I/O region located around the periphery of an internal logic circuit, the I/O cell including a level shift circuit for fulfilling a function other than its own function.

In one embodiment of the invention, the I/O cell further includes a control circuit connected to the level shift circuit.

In another embodiment of the invention, the I/O cell is a power supply cell.

In yet another embodiment of the invention, the I/O cell is a space cell for filling the gap between two given I/O cells.

In yet another embodiment of the invention, the I/O cell is a corner cell for linking a longitudinal part and a lateral part of the I/O region.

In yet another embodiment of the invention, the I/O cell is an input cell for inputting a signal from outside into the internal logic circuit.

As described above, according to the present invention, a level shift circuit for a given I/O cell is placed in a given location outside the given I/O cell within the I/O region. Therefore, the area required for the given I/O cell can be reduced, and the pitch of I/O cells can be reduced. Thus, reduction in the area of the semiconductor chip having the necessary number of pins can be achieved.

In particular, according to the present invention, a level shift circuit that is not asked for high-speed operation, that is, performs DC-like operation in which a given operation is maintained for a long time is selected as the level shift circuit to be placed outside the given I/O cell. Therefore, the high-speed operation of the internal logic circuit can be secured satisfactorily.

Moreover, according to the present invention, among control circuits to be provided for a given I/O cell, a control circuit that is connected to the level shift circuit placed outside the given I/O cell and is not asked for high-speed operation is also placed outside the given I/O cell. Therefore, the area required for the given I/O cell can further be reduced, and thus further reduction in the area of the semiconductor chip having the necessary number of pins can be achieved.

BRIEF DESCRIPTION OF THE DRAWINGS

FIGS. 4A, 4B, 4C and 4D are views showing layouts of an input/output cell, an input cell, a space cell and a corner cell, respectively, in Alteration 1 to Embodiment 1 of the present invention.

FIG. 7 is a view showing a chip layout of a semiconductor integrated circuit device of Alteration 2 to Embodiment 2 of the present invention.

FIGS. 9A, 9B, 9C and 9D are views showing layouts of an input/output cell, an input cell, a space cell and a corner cell, respectively, in Alteration 1 to Embodiment 3 of the present invention.

FIGS. 13A, 13B and 13C are views showing layouts of a conventional input/output cell, a conventional input cell, and a conventional power supply cell, respectively.

FIGS. 14A and 14B are views showing layouts of a conventional space cell and a conventional corner cell, respectively.

DESCRIPTION OF THE PREFERRED EMBODIMENTS

Hereinafter, preferred embodiments of the present invention will be described with reference to the accompanying drawings.

Embodiment 1

A semiconductor integrated circuit device of Embodiment 1 of the present invention will be described with reference to FIGS. 3A and 3B.

Figure 1:
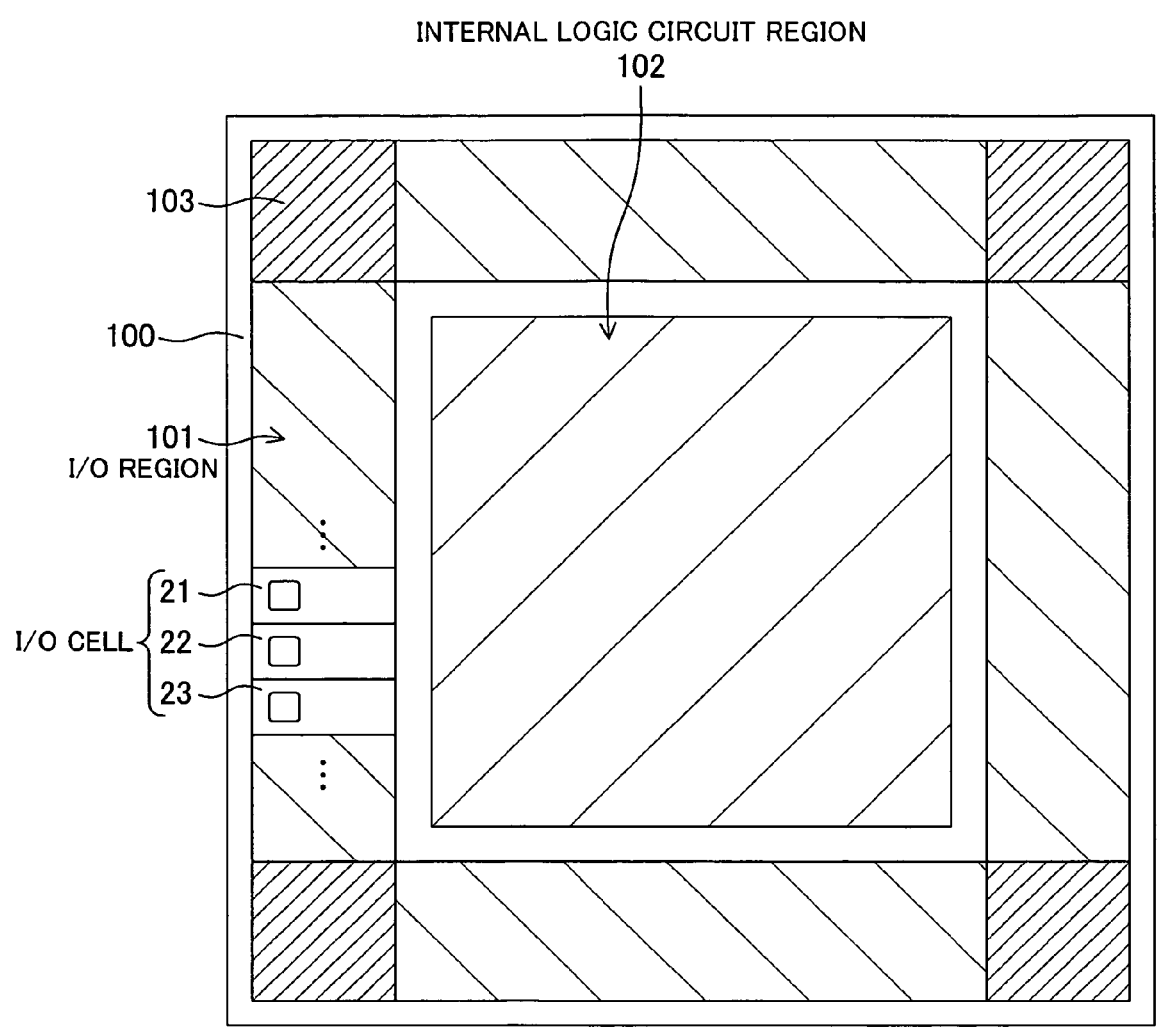
FIG. 1 is a view showing a layout of a semiconductor chip.
Figure 2:
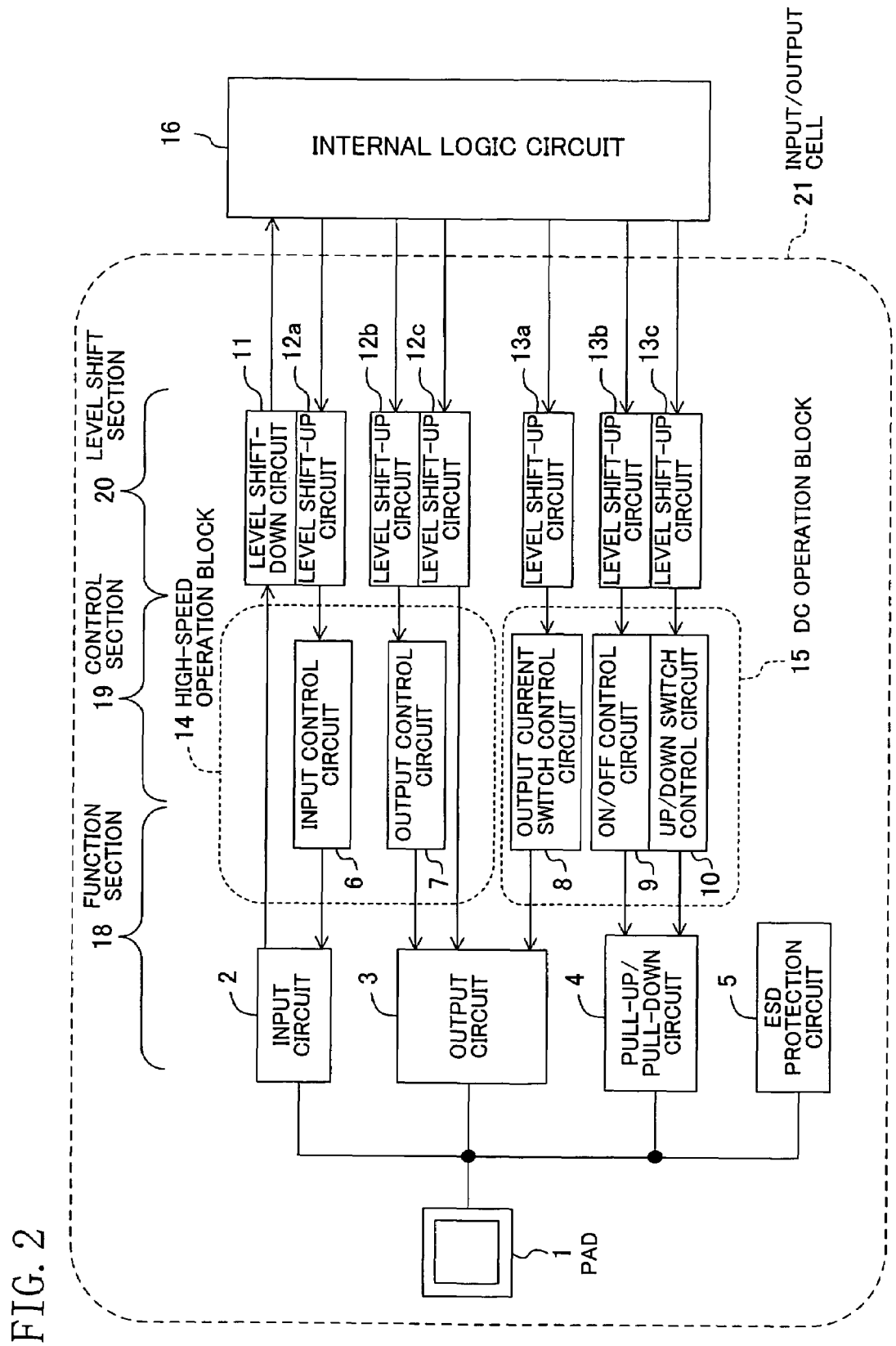
FIG. 2 is a view showing an exemplary circuit configuration of an I/O cell (input/output cell).

The entire layout of the semiconductor integrated circuit device is as shown in FIG. 1, the circuit configuration of an input/output cell is as shown in FIG. 2, and the layouts of various types of I/O cells such as the input/output cell and a power supply cell are as shown in FIGS. 13A to 13C, 14A and 14B. Since these were already described with reference to the relevant drawings, the description thereof is omitted in this embodiment.

In this embodiment, exemplified is the case that level shift circuits for the input/output cell 21 shown in FIG. 2, as the given I/O cell described above, are placed in another I/O cell.

As shown in FIG. 2, the conventional input/output cell 21 has seven level shift circuits 11, 12a to 12c and 13a to 13c placed therein. In this embodiment, as shown in FIG. 3A, three level shift circuits 13a to 13c as part of the level shift circuits belonging to the input/output cell 21 are moved from the input/output cell 21 to be placed in the dead space 26 of the power supply cell 23 (in a given location outside the input/output cell 21 but within the I/O region 101) as shown in FIG. 3B. The power supply cell 23 shown in FIG. 3B therefore has the three level shift circuits 13a to 13c as semiconductor elements other than the power supply wiring (not shown) and the ESD protection circuit 27 provided to fulfill its own function.

As is found from the circuit configuration of FIG. 2, the three level shift circuit 13a to 13c placed in the power supply cell 23 are level shift-up circuits for the output current switch control circuit 8, the pull-up/pull-down ON/OFF control circuit 9 and the pull-up/pull-down switch control circuit 10 that constitute part of the control section 19. These three control circuits 8 to 10 constituting part of the control section 19, which are for switching the output current capability and for controlling whether to pull up or pull down, perform DC-like operation in which once the output current or pull-up/pull-down is switched to a given state, the switched state is maintained for a long time. Therefore, for these circuits, high-speed operation equivalent to that required for the internal logic circuit 16 is not required. No high-speed operation is therefore required for the three level shift circuits 13a to 13c connected to these control circuits 8 to 10 (hereinafter, these three control circuits are correctively called a DC operation block 15), either.

On the contrary, high-speed operation is required for the four level shift circuits 11 and 12a to 12c left in the input/output cell 21. These level shift circuits, which are for input or output of a signal via the input circuit 2 or the output circuit 3, are requested to receive or output a signal at high speed in response to the high-speed operation of the internal logic circuit 16 (hereinafter, these two control circuits 6 and 7 are correctively called a high-speed operation block 14).

Details of the functions of the seven level shift circuits for the input/output cell 21 shown in FIG. 2 are as follows. The level shift circuit 11 shifts the level of a signal received from outside the semiconductor chip downwardly at the time of input of the signal into the internal logic circuit 16. The level shift circuit 12a shifts the level of a control signal for putting the input/output cell 21 in the input state upwardly to an external voltage. The level shift circuit 12b shifts the level of a control signal for putting the input/output cell 21 in the output state upwardly to an external voltage. The level shift circuit 12c shifts the level of a signal from the internal logic circuit 16 upwardly to an external voltage. The level shift circuit 13a shifts the level of a control signal for controlling the switching of the output current capability upwardly to an external voltage. The level shift circuit 13b shifts the level of a control signal required for controlling whether to use or not pull-up resistance or pull-down resistance upwardly. The level shift circuit 13c shifts the level of a control signal required for controlling which to use pull-up resistance or pull-down resistance upwardly.

Accordingly, in this embodiment, among the seven level shift circuits for the input/output cell 21, which is largest in the number of circuits and in area among the three types of I/O cells, that is, the input/output cell 21, the input cell 22 and the power supply cell 23 shown in FIGS. 13A to 13C, three level shift circuits 13a to 13c are placed in the power supply cell 23 having the dead space 26, not in the own input/output cell 21. Therefore, the area and width of the input/output cell 21 can be reduced. As a result, the pitch of a large number of I/O cells arranged in the I/O region 101 can be reduced, and thus the area of the I/O region 101 can be reduced. This permits adaptation to the trend of a larger number of pins as the semiconductor chip and effective reduction in the area of the semiconductor chip.

(Alteration 1 to Embodiment 1)

FIGS. 4A to 4D show Alteration 1 to Embodiment 1 described above.

In Embodiment 1, the three level shift circuits 13a to 13c for the input/output cell 21 were placed in the power supply cell 23. In this alteration, these three level shift circuits are placed in different locations.

Specifically, the three level shift circuits 13a to 13c for the input/output cell 21 are moved from the input/output cell 21 as shown in FIG. 4A, and placed in the dead spaces 26 of the input cell 22, the space cell 24 and the corner cell 25, respectively, as shown in FIGS. 4B, 4C and 4D. As a result, the input cell 22 has one level shift circuit 13a for fulfilling a function other than its own function, in addition to the function section 18, the high-speed operation block 14 and two level shift circuits 11 and 12a for fulfilling its own function. Likewise, the space cell 24 and the corner cell 25 respectively have the level shift circuits 13b and 13c for fulfilling a function other than their own functions.

Accordingly, in Alteration 1, also, substantially the same effect as that in Embodiment 1 can be provided. In this way, according to the present invention, part or all of level shift circuits belonging to a given I/O cell having one or more level shift circuits can be placed in a location within the I/O region other than inside the given I/O cell. Therefore, the given I/O cell having a level shift circuit placed outside the own I/O cell is not limited to the input/output cell 21 described above, but may be an output cell (not shown) that outputs a signal from the internal logic circuit 16 externally, the input cell 22 shown in FIG. 13A, or the like. Also, the type of the I/O cell in which a level shift circuit for another I/O cell is placed is not limited, but may be any I/O cell having dead space.

Embodiment 2

Figure 5:
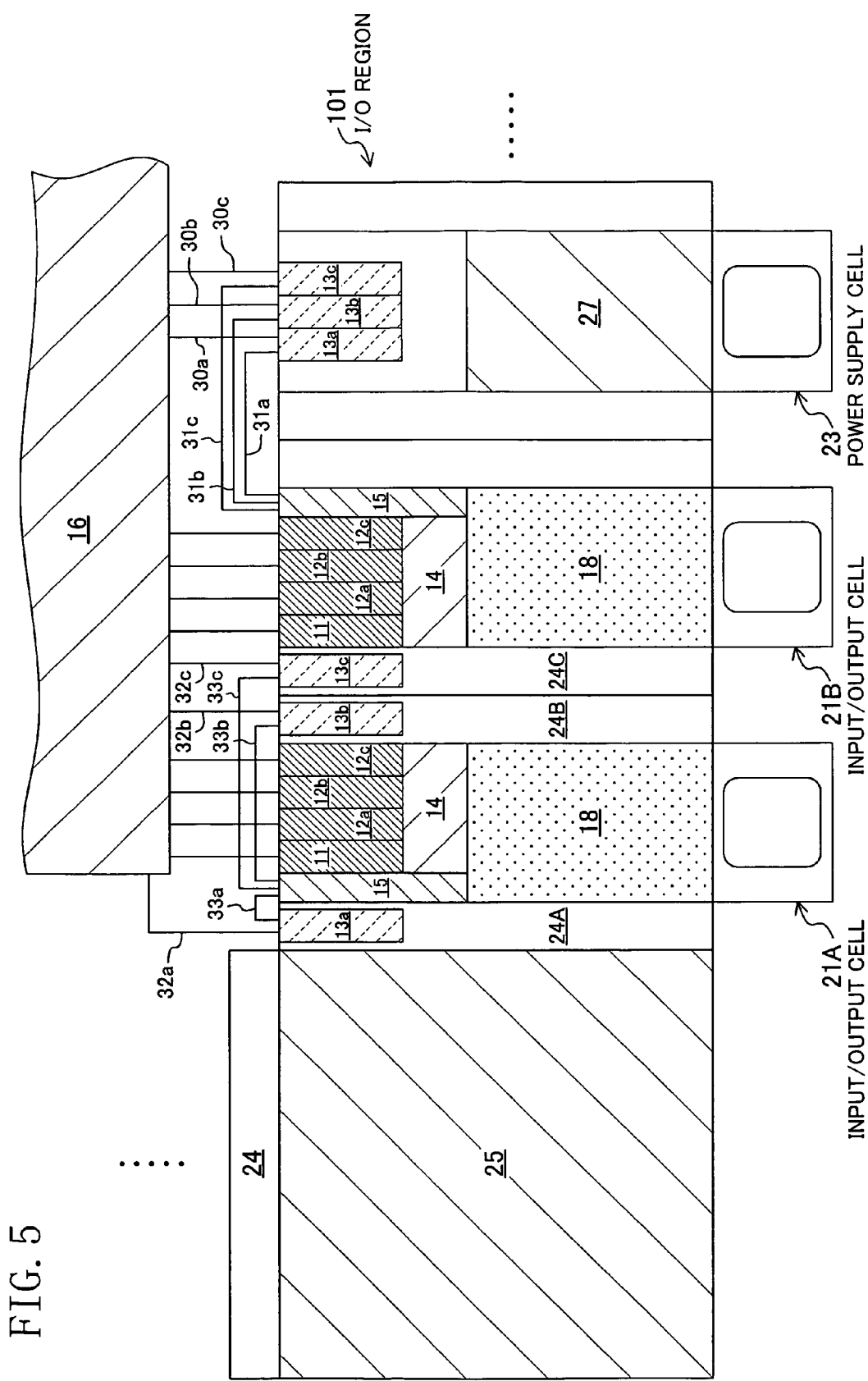
FIG. 5 is a view showing a chip layout of a semiconductor integrated circuit device of Embodiment 2 of the present invention.

FIG. 5 shows Embodiment 2 of the present invention.

In FIG. 5, a semiconductor integrated circuit device includes two input/output cells 21A and 21B and a power supply cell 23 placed on the right side of a corner cell 25 as is viewed from FIG. 5.

Three level shift circuits 13a to 13c for the input/output cell 21B, the one on the right of the two input/output cells 21A and 21B, are placed in the power supply cell 23, whereas three level shift circuits 13a to 13c for the input/output cell 21A on the left are placed in space cells 24A and 24B located on the left and right sides of the input/output cell 21A and a space cell 24C located on the left side of the input/output cell 21B, respectively.

Three lines 30a to 30c from the internal logic circuit 16 are respectively connected to the three level shift circuits 13a to 13c placed in the power supply cell 23, and three lines 31a to 31c respectively from the level shift circuits 13a to 13c are connected to the DC operation block 15 in the own input/output cell 21B. Likewise, three lines 32a to 32c from the internal logic circuit 16 are respectively connected to the three level shift circuits 13a to 13c placed in the three space cells 24A to 24C, and three lines 33a to 33c respectively from the level shift circuits 13a to 13c are connected to the DC operation block 15 in the own input/output cell 21A, to thereby achieve desired functions. In this manner, although longer connection lines 30a to 30c, 31a to 31c, 32a to 32c and 33a to 33c are necessary for the level shift circuits 13a to 13c for the input/output cells 21A and 21B, placed outside their own input/output cells, these level shift circuits 13a to 13c are for the DC operation block 15 that is not asked for high-speed operation. Therefore, the high-speed operation in transmission/reception of signals between the internal logic circuit 16 and the outside can be maintained satisfactorily.

(Alteration 1 to Embodiment 2)

Figure 6:
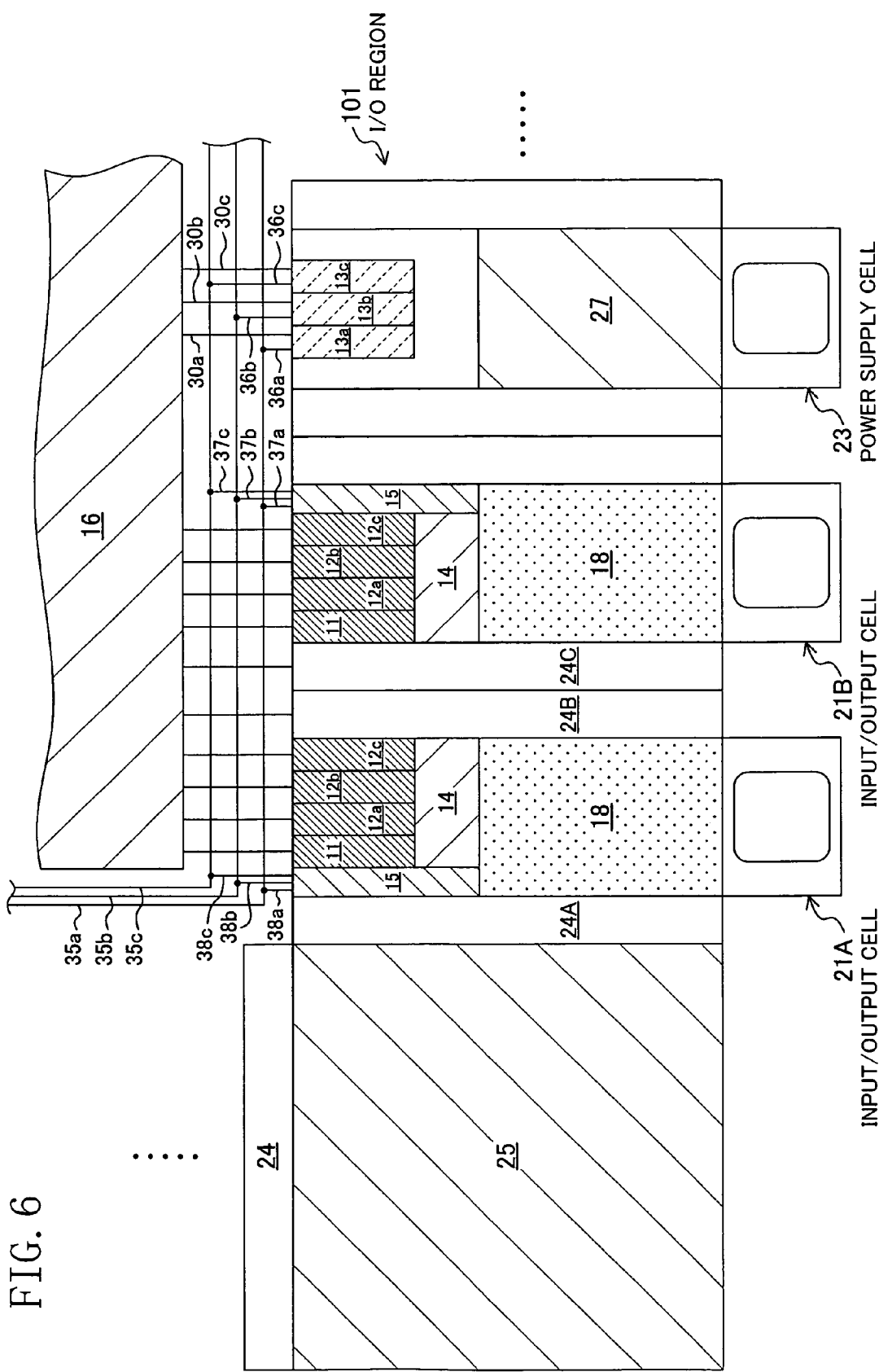
FIG. 6 is a view showing a chip layout of a semiconductor integrated circuit device of Alteration 1 to Embodiment 2 of the present invention.

FIG. 6 shows Alteration 1 to Embodiment 2 of the present invention.

In Embodiment 2 described above, the level shift circuits 13a to 13c for each of the input/output cells 21A and 21B were placed externally. In this alteration, the level shift circuits 13a to 13c are shared by the input/output cells 21A and 21B.

Specifically, as shown in FIG. 6, while the level shift circuits 13a to 13c are placed in the power supply cell 23, none is placed in the three space cells 24a to 24c. Three common lines 35a to 35c run along the periphery of the internal logic circuit 16 in the space between the internal logic circuit 16 and the I/O region 101. The level shift circuits 13a to 13c that have received signals from the internal logic circuit 16 via three lines 30a to 30c, respectively, send respective level-raised signals to the common lines 35a to 35c via three lines 36a to 36c, respectively. The signals are then supplied to the DC operation block 15 in the input/output cell 21B on the right via three lines 37a to 37c, respectively, and also supplied to the DC operation block 15 in the input/output cell 21A on the left via three lines 38a to 38c, respectively.

Accordingly, in Alteration 1, the signals level-raised by the common level shift circuits 13a to 13c are shared by the two input/output cells 21A and 21B, to enable one-time control of the functions of the two input/output cells 21A and 21B. This shared use of the level shift circuits 13a to 13c also enables reduction in the number of power supply lines for level shifting, and thus further reduction in the area of the I/O region 101 can be achieved.

Although the common lines 35a to 35c are placed in the space between the internal logic circuit 16 and the I/O region 101, they may be placed to run above the internal logic circuit 16.

(Alteration 2 to Embodiment 2)

FIG. 7 shows Alteration 2 to Embodiment 2 of the present invention.

In this alteration, as shown in FIG. 7, common lines 39a to 39c are placed to run above the I/O region 101 for distributing the signals from the level shift circuits 13a to 13c.

With the configuration described above, in this alteration, the signal wiring region between the internal logic circuit 16 and the I/O region 10 can be reduced, and yet reduction in the area of the I/O region 101 can be achieved.

Embodiment 3

Figure 8A:
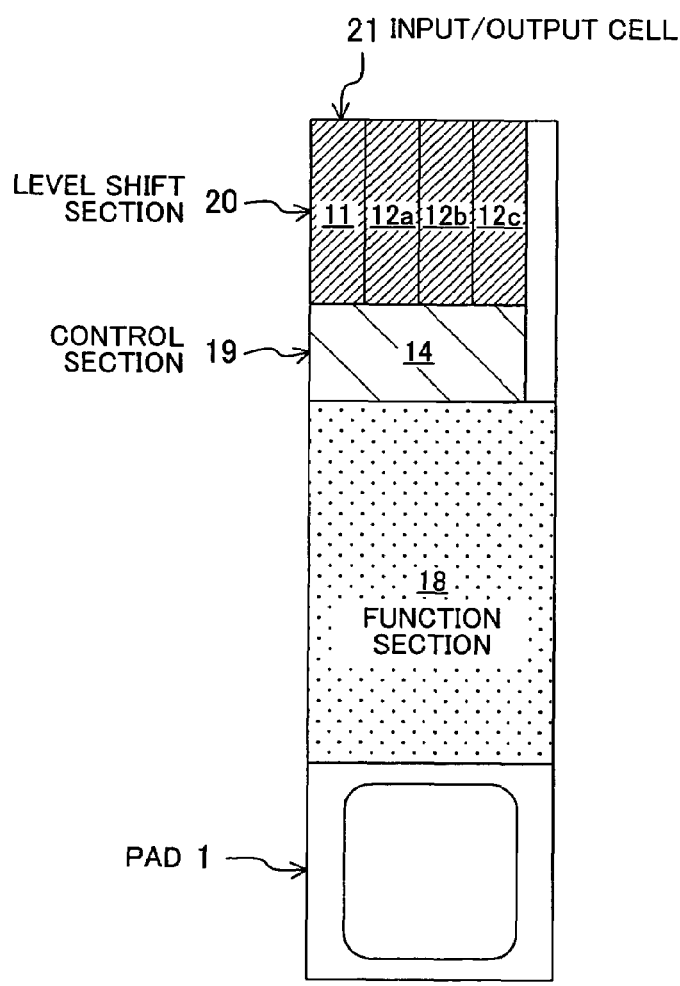
FIGS. 8A and 8B are views showing layouts of an input/output cell and a power supply cell in Embodiment 3 of the present invention.
Figure 8B:
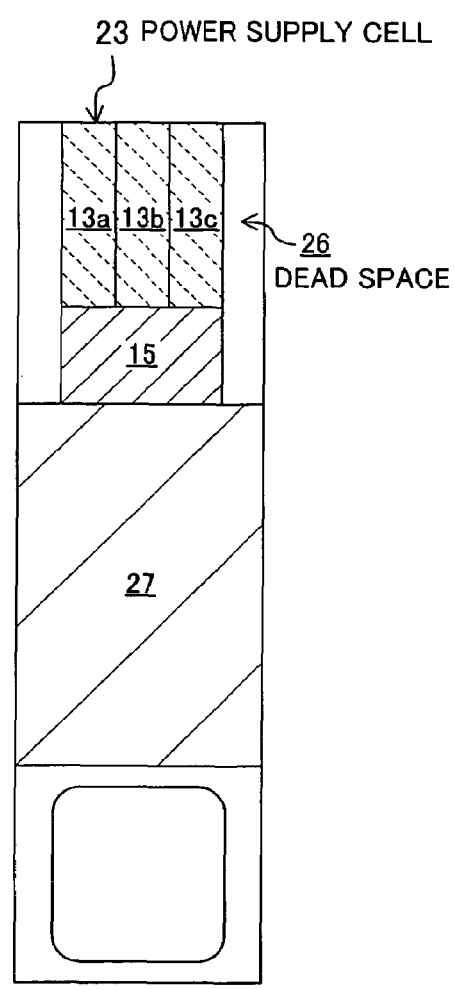

Embodiment 3 of the present invention will be described with reference to FIGS. 8A and 8B.

Figure 3A:
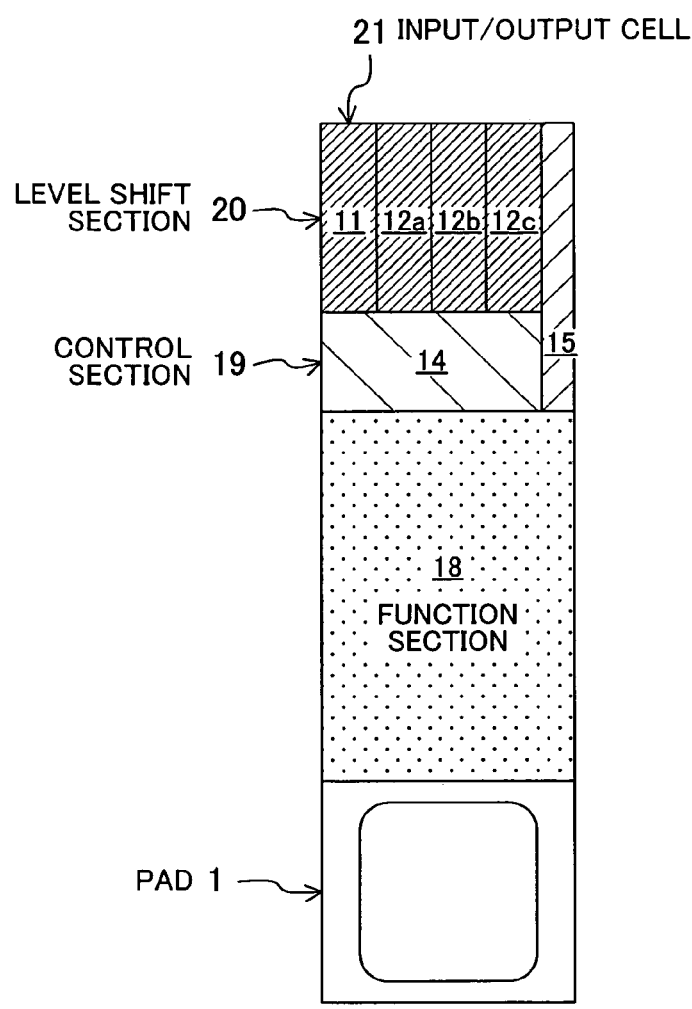
FIGS. 3A and 3B are views showing layouts of an input/output cell and a power supply cell, respectively, in Embodiment 1 of the present invention.
Figure 3B:
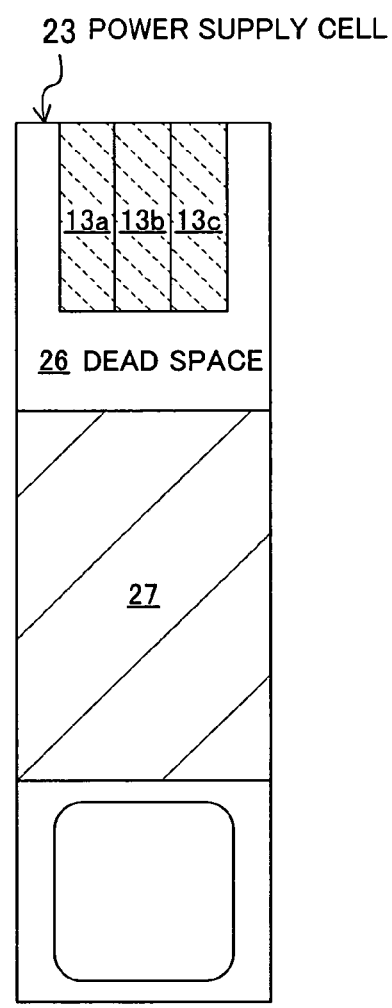

In Embodiment 1, the three level shift circuits 13a to 13c for the input/output cell 21 were placed outside the input/output cell 21, as shown in FIGS. 3A and 3B. In this embodiment, in addition to the three level shift circuits 13a to 13c, the DC operation block 15 connected to these level shift circuits 13a to 13c is also placed outside the input/output cell 21.

Specifically, the DC operation block 15 shown in FIG. 2, which is not asked for high-speed operation, is placed in the dead space 26 of the power supply cell 23, together with the level shift circuits 13a to 13c.

Accordingly, in this embodiment, since the area and width of the input/output cell 21 having the largest area can be further reduced, the pitch of the I/O cells can be further reduced, and thus the area of the I/O region can be reduced. This permits adaptation to the trend of a larger number of pins of the semiconductor chip and further reduction in the size of the semiconductor chip.

(Alteration 1 to Embodiment 3)

FIGS. 9A to 9D show Alteration 1 to Embodiment 3 of the present invention.

This alteration corresponds to FIGS. 4A to 4D showing Alteration 1 to Embodiment 1, in which the output current switch control circuit 8, the pull-up/pull-down ON/OFF control circuit 9 and the pull-up/pull-down switch control circuit 10 of the DC operation block 15 are respectively placed in the input cell 22, the space cell 24 and the corner cell 25.

Embodiment 4

Figure 10:
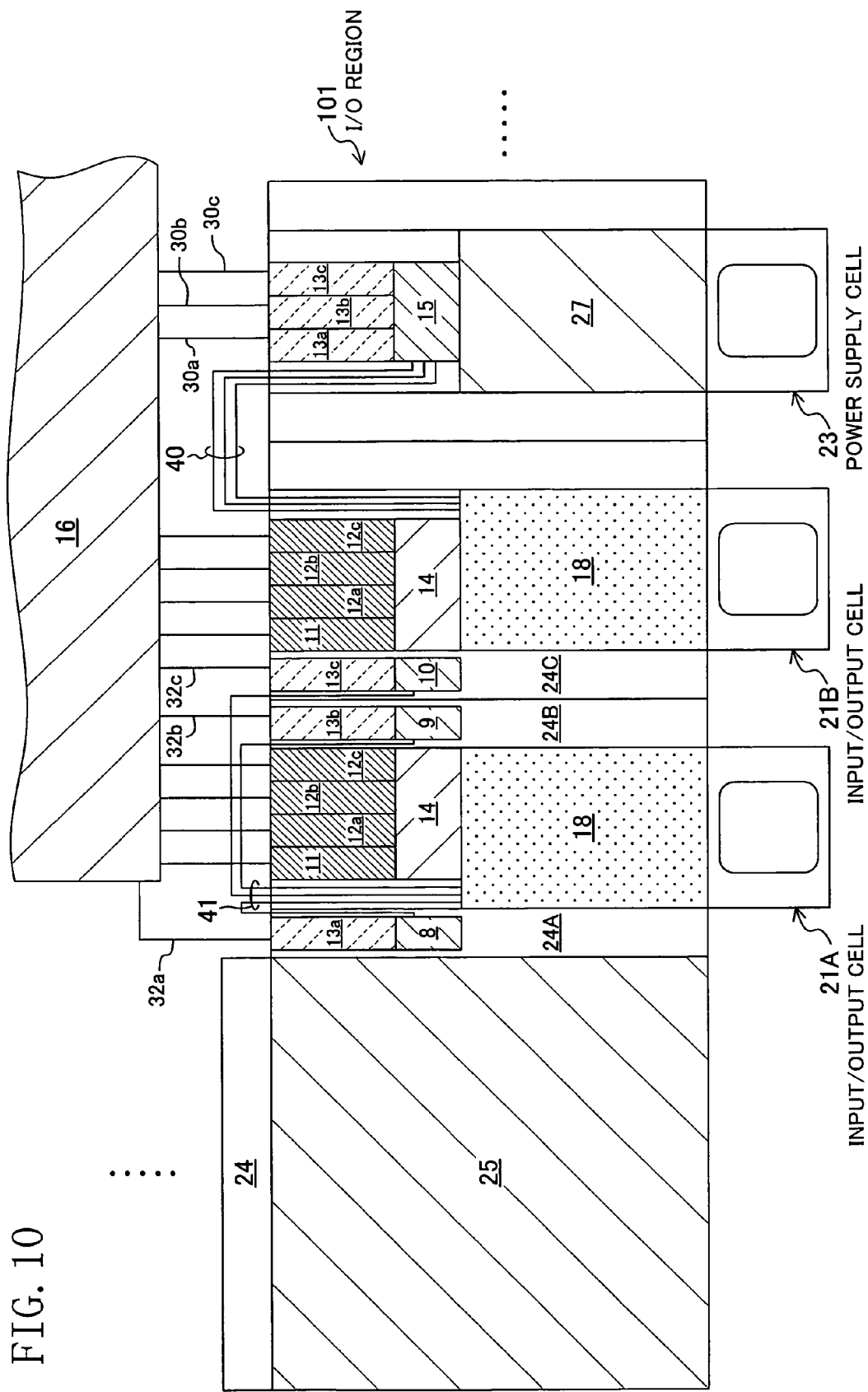
FIG. 10 is a view showing a chip layout of a semiconductor integrated circuit device of Embodiment 4 of the present invention.

FIG. 10 shows Embodiment 4 of the present invention.

In a semiconductor integrated circuit of FIG. 10, the DC operation blocks 15, 15 of the two input/output cells 21A and 21B are placed outside the input/output cells 21A and 21B, together with the level shift circuits 13a to 13b.

FIG. 10 corresponds to FIG. 5 showing the semiconductor integrated circuit device of Embodiment 2, but is different from FIG. 5 in that the DC operation blocks 15, 15 of the two input/output cells 21A and 21B are placed in the power supply cell 23 and the space cells 24A to 24C, and thus the DC operation blocks 15, 15 are connected to the corresponding function sections 18 in their own input/output cells 21A and 21B.

(Alterations 1 and 2 to Embodiment 4)

Figure 11:
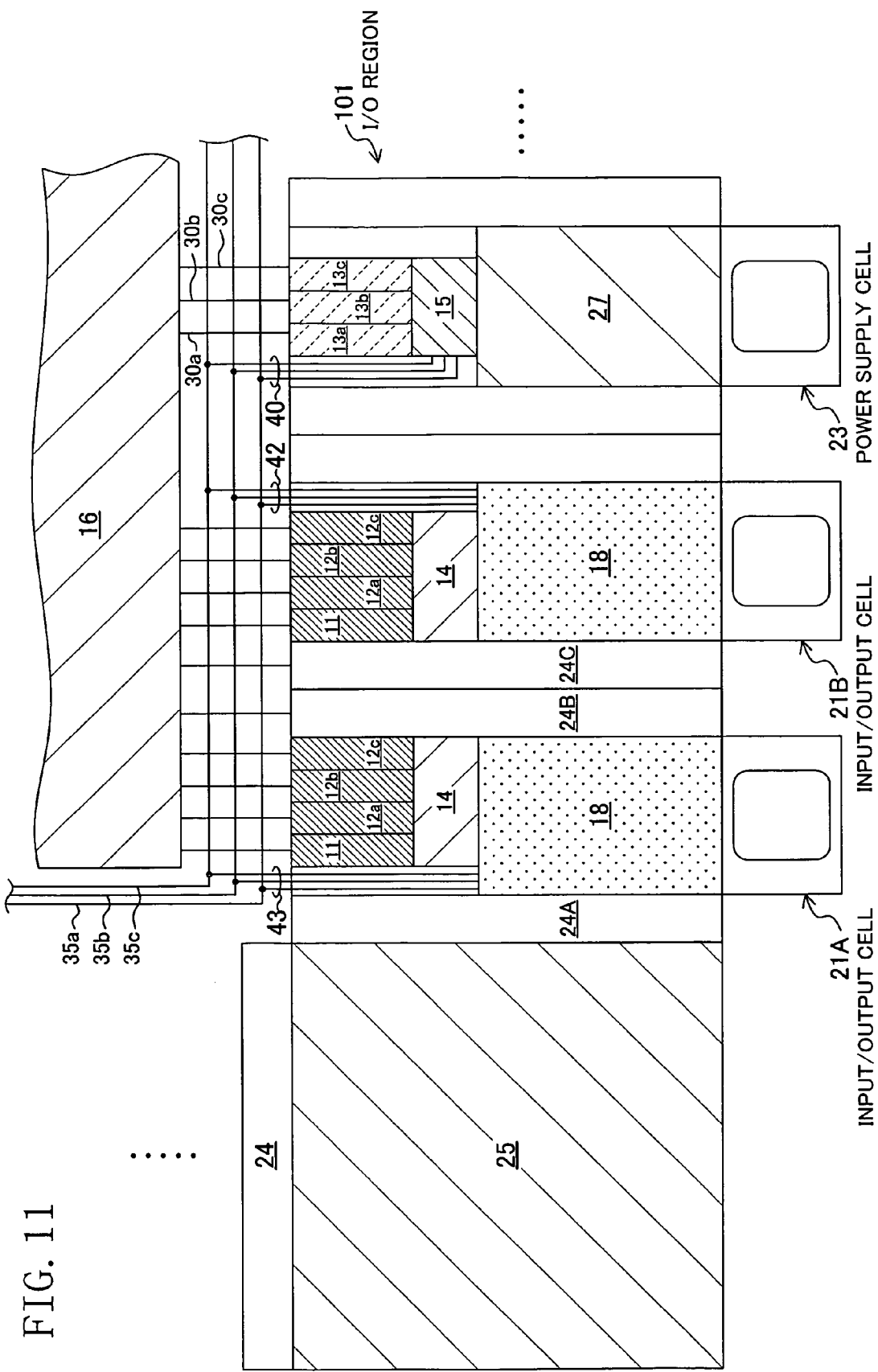
FIG. 11 is a view showing a chip layout of a semiconductor integrated circuit device of Alteration 1 to Embodiment 4 of the present invention.
Figure 12:
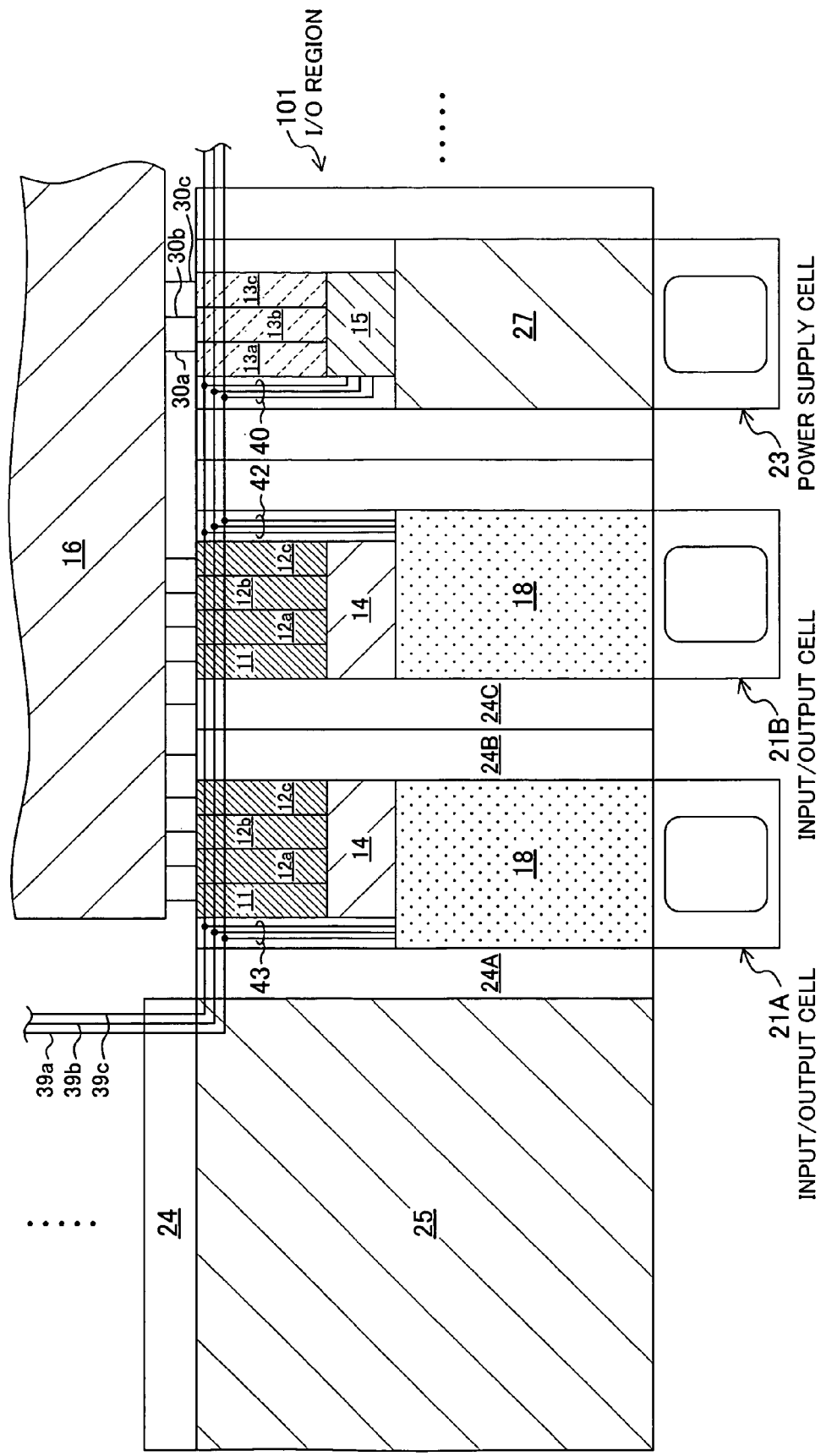
FIG. 12 is a view showing a chip layout of a semiconductor integrated circuit device of Alteration 2 to Embodiment 4 of the present invention.
Figure 15:
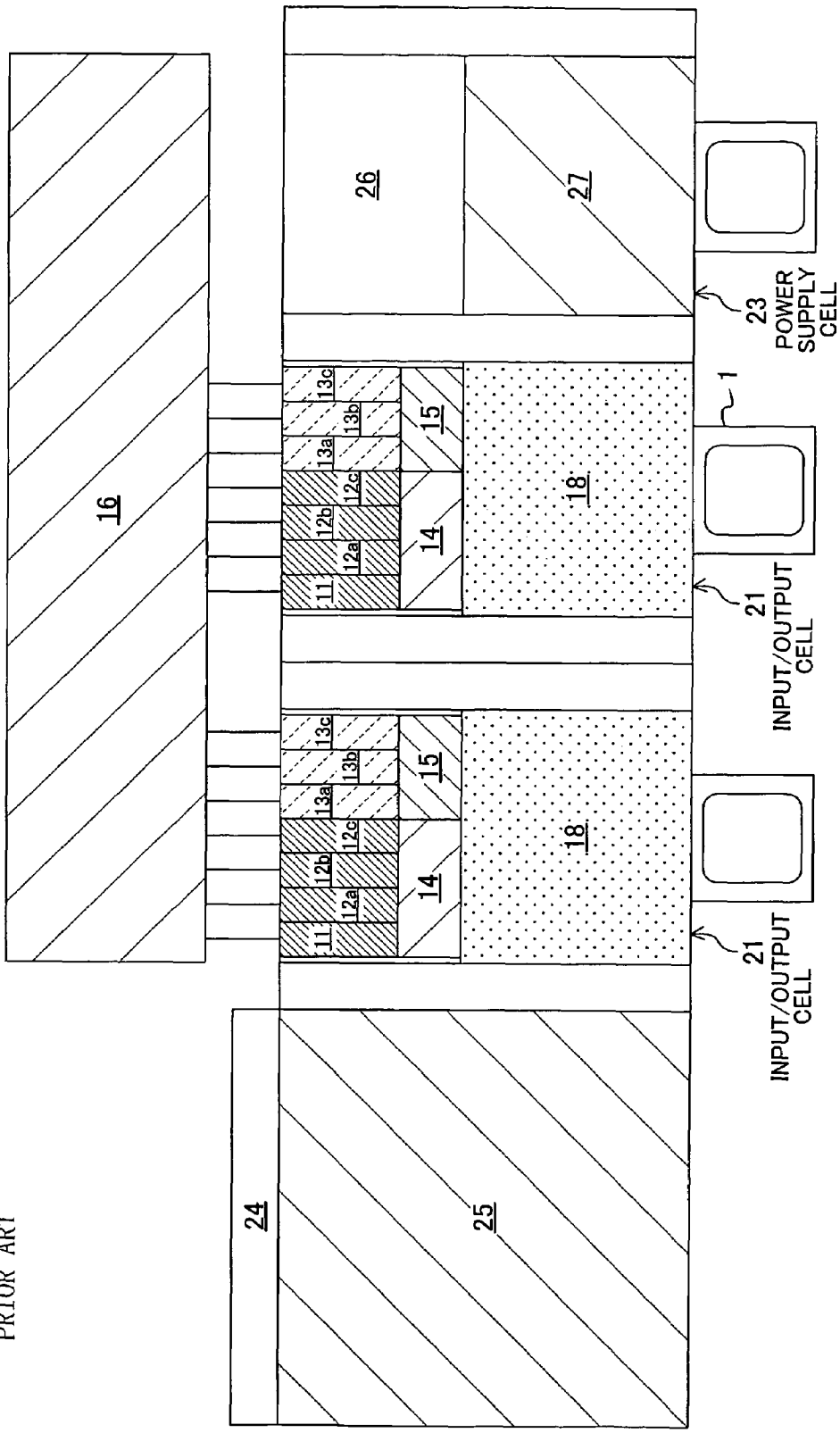
FIG. 15 is a view showing a chip layout of a conventional semiconductor integrated circuit device.

FIGS. 11 and 12 show Alterations 1 and 2 to Embodiment 4 described above.

In Alteration 1 shown in FIG. 11, which corresponds to Alteration 1 to Embodiment 2, the level shift circuits 13a to 13c and the DC operation block 15 are shared by the two input/output cells 21A and 21B, to enable one-time control of the functions of the input/output cells 21A and 21B.

In Alteration 2 shown in FIG. 12, which corresponds to Alteration 2 to Embodiment 2, the common lines 35a to 35c shown in FIG. 11, arranged in the signal wiring region between the internal logic circuit 16 and the I/O region 101, are changed to common lines 39a to 39c running above the I/O region 101.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor integrated circuit device comprising:
    an internal logic circuit; and
    a plurality of I/O cells placed in an I/O region located around the periphery of the internal logic circuit for securing interface with an external signal,
    wherein at least one given I/O cell among the plurality of I/O cells has at least one level shift circuit, and
    the level shift circuit for the given I/O cell is placed in a given location outside the given I/O cell and within the I/O region.

2. The device of claim 1, wherein the level shift circuit for the given I/O cell, placed in the given location within the I/O region, is connected to the internal logic circuit via a line and also connected to the given I/O cell via another line.

3. The device of claim 2, wherein the given I/O cell is an input/output cell for inputting/outputting a signal into/from the internal logic circuit from/to outside.

4. The device of claim 2, wherein the given I/O cell is an output cell for outputting a signal from the internal logic circuit to outside.

5. The device of claim 2, wherein the given I/O cell is an input cell for inputting a signal from outside into the internal logic circuit.

6. The device of claim 2, wherein the level shift circuit for the given I/O cell is a level shift-up circuit that is not asked for high-speed operation equivalent to high-speed operation of the internal logic circuit and shifts the level of a signal from the internal logic circuit upwardly to an external signal voltage.

7. The device of claim 2, wherein the I/O cells placed in the I/O region include a power supply cell, and
    the given location within the I/O region in which the level shift circuit for the given I/O cell is placed is inside the power supply cell.

8. The device of claim 2, wherein the I/O cells placed in the I/O region include a space cell for filling the gap between two given I/O cells, and the given location within the I/O region in which the level shift circuit for the given I/O cell is placed is inside the space cell.

9. The device of claim 2, wherein the I/O cells placed in the I/O region include a corner cell for linking a longitudinal part and a lateral part of the I/O region, and
the given location within the I/O region in which the level shift circuit for the given I/O cell is placed is inside the corner cell.

10. The device of claim 2, wherein the I/O cells placed in the I/O region include an input cell for inputting a signal from outside into the internal logic circuit, and
the given location within the I/O region in which the level shift circuit for the given I/O cell is placed is inside the input cell.

11. The device of claim 1, wherein the given I/O cell includes a control circuit that is connected to the level shift circuit and is not asked for high-speed operation, and
the control circuit is placed in a given location outside the given I/O cell and within the I/O region, together with the level shift circuit.

12. The device of claim 11, wherein the control circuit is an output current switch control circuit for switching the output current capability from the given I/O cell.

13. The device of claim 11, wherein the control circuit is an ON/OFF control circuit for switching whether to use or not a pull-up or pull-down function for fixing the potential at a terminal of the given I/O cell to "H" or "L".

14. The device of claim 11, wherein the control circuit is a pull-up/pull-down switch control circuit for fixing the potential at a terminal of the given I/O cell to "H" or "L".

15. The device of claim 2, wherein the given I/O cell comprises a plurality of given I/O cells,
the plurality of given I/O cells share the at least one level shift circuit, and
the shared level shift circuit is placed in a given location outside the given I/O cells and within the I/O region.

16. The device of claim 2, wherein the level shift circuit placed in a given location within the I/O region is connected to the given I/O cell via a line arranged outside the I/O region.

17. The device of claim 2, wherein the level shift circuit placed in a given location within the I/O region is connected to the given I/O cell via a line arranged to run above the I/O region.

18. An I/O cell placed in an I/O region located around the periphery of an internal logic circuit, the I/O cell comprising a level shift circuit for fulfilling a function other than its own function.

19. The I/O cell of claim 18, further comprising a control circuit connected to the level shift circuit.

20. The I/O cell of claim 18, wherein the I/O cell is a power supply cell.

21. The I/O cell of claim 18, wherein the I/O cell is a space cell for filling the gap between two given I/O cells.

22. The I/O cell of claim 18, wherein the I/O cell is a corner cell for linking a longitudinal part and a lateral part of the I/O region.

23. The I/O cell of claim 18, wherein the I/O cell is an input cell for inputting a signal from outside into the internal logic circuit.

* * * * *